US011528013B2

(12) United States Patent
Yadav (10) Patent No.: US 11,528,013 B2
(45) Date of Patent: *Dec. 13, 2022

(54) SYSTEMS AND METHOD FOR A LOW POWER CORRELATOR ARCHITECTURE USING DISTRIBUTED ARITHMETIC

(71) Applicant: The MITRE Corporation, McLean, VA (US)

(72) Inventor: Rishi Yadav, Nashua, NH (US)

(73) Assignee: The MITRE Corporation, McLean, VA (US)

( * ) Notice: Subject to any disclaimer, the term of this patent is extended or adjusted under 35 U.S.C. 154(b) by 219 days.

This patent is subject to a terminal disclaimer.

(21) Appl. No.: 17/135,496

(22) Filed: Dec. 28, 2020

(65) Prior Publication Data

US 2021/0152156 A1 May 20, 2021

Related U.S. Application Data

(63) Continuation of application No. 16/146,479, filed on Sep. 28, 2018, now Pat. No. 10,879,877.

(51) Int. Cl.
*H03H 17/06* (2006.01)
*G06F 7/544* (2006.01)
*H03H 17/02* (2006.01)

(52) U.S. Cl.
CPC ........... *H03H 17/06* (2013.01); *G06F 7/5443* (2013.01); *H03H 17/0225* (2013.01)

(58) Field of Classification Search
CPC ............... H03H 17/06; H03H 17/0248; H03H 17/0223; H03H 17/0225; H03H 17/0241; H03H 2218/08; H03H 2218/085; H03H 2218/10; H03H 2017/0245;
(Continued)

(56) References Cited

U.S. PATENT DOCUMENTS 4,136,398 A   1/1979   Eggermont
5,301,134 A   4/1994   Maruyama
5,831,880 A   11/1998  Lee
(Continued)

FOREIGN PATENT DOCUMENTS

JP    63-35023 A     2/1988
KR    10-0298127 B1  5/2001
(Continued)

OTHER PUBLICATIONS

Andraka (1999). "FPGAs Make a Radar Signal Processor on a Chip a Reality", 1999 IEEE, pp. 559-563.
(Continued)

*Primary Examiner* — Emily E Larocque
(74) *Attorney, Agent, or Firm* — Morrison & Foerster LLP (57) ABSTRACT

Provided herein is an implementation of a finite impulse response (FIR) filter that uses a distributed arithmetic architecture. In one or more example, a data sample with multiple bits is processed through a plurality of bit-level multiply and accumulate circuits, wherein each bit of the data sample corresponds to a bit of the data sample. The output of each bit-level multiply and accumulate circuit can then be shifted by an appropriate amount based on the bit placement of the bit of the data sample that corresponds to the bit-level multiply and accumulate circuit. After each output is shifted by the appropriate amount, the outputs can be aggregated to form a final FIR filter result.

7 Claims, 9 Drawing Sheets

(58) Field of Classification Search
CPC .......... H03H 2017/0081; G06F 7/5443; G06F 17/10; G06F 17/15; G06F 17/17
See application file for complete search history.

(56) References Cited

U.S. PATENT DOCUMENTS

| | | | |
|---|---|---|---|
| 6,032,171 | A | 2/2000 | Kiriaki et al. |
| 6,035,320 | A | 3/2000 | Kiriaki et al. |
| 6,108,681 | A | 8/2000 | Wittig et al. |
| 6,606,641 | B1 | 8/2003 | Wittig et al. |
| 7,054,896 | B2 | 5/2006 | Lee et al. |
| 7,107,301 | B2 | 9/2006 | Rylov et al. |
| 7,164,712 | B2 | 1/2007 | Wittig |
| 7,167,514 | B2 | 1/2007 | McElroy et al. |
| 7,289,558 | B2 | 10/2007 | Bose et al. |
| 7,565,389 | B2 | 7/2009 | Runze |
| 7,587,440 | B2 | 9/2009 | Aramaki |
| 7,917,569 | B2 | 3/2011 | Bhuvanagiri et al. |
| 8,131,790 | B2 | 3/2012 | Masumoto |
| 2001/0056450 | A1 | 12/2001 | Kiriaki |
| 2003/0169778 | A1 | 9/2003 | Rylov et al. |

FOREIGN PATENT DOCUMENTS

| | | |
|---|---|---|
| KR | 2001-0091159 A | 10/2001 |
| KR | 10-0335252 B1 | 4/2002 |
| KR | 10-0746856 B1 | 8/2007 |

OTHER PUBLICATIONS

Danne, Klaus (2004) "Distributed Arithmetic FPGA Design with Online Scalable Size and Performance," 17th Symposium on Integrated Circuits and Systems Design, Sep. 7-11, Pernambuco, Brazil; pp. 135-140.

Grover, R.S. et al. (2002) "A Faster Distributed Arithmetic Architecture for FPGAs," ACM/SIGDA Tenth International Symposium on Field-Programmable Gate Arrays, Feb. 24-26, Monterey, California; pp. 31-39.

Hwang, Sangyun, et al. (May 2004). "New Distributed Arithmetic Algorithm for Low-Power FIR Filter Implementation," IEEE Signal Processing Letters 11(5): 463-466.

Martinez-Peiro et al. (1999). "A Comparison Between Lattice, Cascade and Direct-Form FIR Filter Structures By Using a FPGA Bit-Serial Distributed Arithmetic Implementation", 1999 IEEE, pp. 241-244.

Meher et al. "High-Throughput Pipelined Realization of Adaptive FIR Filter Based on Distributed Arithmetic", 2011 IEEE/IFIP 19th International Conference on VLSI and System-on-Chip, Oct. 3-5, 2011, Hong Kong, China; 6 pages.

Meher, P.K. (Mar. 2010) "New Approach to Look-Up-Table Design and Memory-Based Realization of FIR Digital Filter," IEEE Transactions on Circuits and Systems I: Regular Papers 57(3): 592-603.

Mirzaei, S. et al. (2006) "FPGA Implementation of High Speed FIR Filters Using Add and Shift Method," International Conference on Computer Design, Oct. 1-4, San Jose, California; pp. 308-313.

Moeller et al, "Field Programmable Gate Array Based Radar Front-End Digital Signal Processing", 7th Annual IEEE Symposium on Field-Programmable Custom Computing Machines 1999, Lexington, Massachusetts; pp. 1-10.

Moeller, T.J. (1999) "Field Programmable Gate Arrays for Radar Front-End Digital Signal Processing," Doctoral dissertation, Massachusetts Institute of Technology; 116 pages.

NagaJyothi et al. (2017) "Distributed Arithmetic Architectures for FIR Filters-A Comparative review", IEEE WISPNET 2017 Conference, pp. 2684-2690.

Yadav, U.S. Office Action dated Feb. 13, 2020 directed to U.S. Appl. No. 16/146,479; 15 pages

SYSTEMS AND METHOD FOR A LOW POWER CORRELATOR ARCHITECTURE USING DISTRIBUTED ARITHMETIC

CROSS-REFERENCE TO RELATED APPLICATION

This application is a continuation of U.S. application Ser. No. 16/146,479, filed Sep. 28, 2018, the entire contents of which are incorporated herein by reference.

STATEMENT OF RIGHTS TO INVENTIONS MADE UNDER FEDERALLY SPONSORED RESEARCH

This invention was made with Government support under U.S. Government contract FA8702-18-C-0001 awarded by the U.S. Air Force Space and Missile Systems Center, Global Positioning Systems Directorate (SMC/GP). The Government has certain rights in this invention.

FIELD OF THE DISCLOSURE

This disclosure relates to systems and methods for implementing a low power correlator architecture using distributed arithmetic. These systems and methods can be used to implement a finite impulse response (FIR) filter (i.e., a correlator) with improved power consumption and smaller footprint than conventional implementations of an FIR filter.

BACKGROUND OF THE DISCLOSURE

FIR filters are commonly used in signal processing designs for signal conditioning. FIR filters receive an input signal and are generally configured to block pre-specified frequency components of the input signals. The resultant output signal from an FIR filter can be equal to the input signal with the pre-specified frequency components of the input signal removed or substantially attenuated. FIR filters are commonly employed in various signal processing applications such as communications and video/audio processing.

FIR filters are generally implemented using either analog components to filter continuous analog waveforms or can be implemented digitally to filter digital (discrete) waveforms. Implementing an FIR filter in a circuit can present challenges with respect to power consumption and footprint (i.e., the amount of space taken up by the circuit). Multiple techniques have been proposed to implement digital FIR filters. The most common approach is the multiply and accumulate (MAC) approach. This is derived directly from the mathematical formula representing the impulse response of the FIR filter expressed in equation 1. However, a MAC approach to implementing an FIR filter can often require numerous multiplier and adder stages, all of which in aggregate can consume a significant amount of power during the operation of the FIR filter. Furthermore, the numerous multiplier and adder stages can also occupy a large amount of space on a circuit board or device that includes the FIR filter.

Thus, an approach to implementing an FIR filter that requires less power and less space is desirable in order to decrease the operational costs associated with including an FIR filter in any given signal processing system.

SUMMARY OF THE DISCLOSURE

Accordingly, systems and methods for implementing an FIR filter using a distributed arithmetic architecture are provided. By applying a circuit architecture that utilizes a distributed arithmetic approach to implementing an FIR filter, the number of high power consuming components required to implement the FIR filters can be reduced, thereby reducing the amount of power consumed by the FIR filter, as well as reducing the footprint of the FIR filter.

DETAILED DESCRIPTION OF THE DISCLOSURE

In the following description of the disclosure and embodiments, reference is made to the accompanying drawings in which are shown, by way of illustration, specific embodiments that can be practiced. It is to be understood that other embodiments and examples can be practiced and changes can be made without departing from the scope of the disclosure.

In addition, it is also to be understood that the singular forms "a," "an," and "the" used in the following description are intended to include the plural forms as well, unless the context clearly indicates otherwise. It is also to be understood that the term "and/or" as used herein refers to and encompasses any and all possible combinations of one or more of the associated listed items. It is further to be understood that the terms "includes," "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

Some portions of the detailed description that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic, or optical signals capable of being stored, transferred, combined, compared, and otherwise manipulated. It is convenient at times, principally for reasons of common usage, to refer to these signals as bits, values, elements, symbols, characters, terms, numbers, or the like. Furthermore, it is also convenient at times to refer to certain arrangements of steps requiring physical manipulations of physical quantities as modules or code devices without loss of generality.

However, all of these and similar terms are to be associated with the appropriate physical quantities and are merely convenient labels applied to these quantities. Unless specifically stated otherwise as apparent from the following discussion, it is appreciated that, throughout the description, discussions utilizing terms such as "processing," "computing," "calculating," "determining," "displaying," or the like refer to the action and processes of a computer system, or similar electronic computing device, that manipulates and transforms data represented as physical (electronic) quantities within the computer system memories or registers or other such information storage, transmission, or display devices.

Certain aspects of the present invention include process steps and instructions described herein in the form of an algorithm. It should be noted that the process steps and instructions of the present invention could be embodied in software, firmware, or hardware and, when embodied in software, could be downloaded to reside on and be operated from different platforms used by a variety of operating systems.

The present invention also relates to a device for performing the operations herein. This device may be specially constructed for the required purposes, or it may comprise a general-purpose computer selectively activated or reconfigured by a computer program stored in the computer. Such a computer program may be stored in a non-transitory, computer-readable storage medium, such as, but not limited to, any type of disk, including floppy disks, optical disks, CD-ROMs, magnetic-optical disks, read-only memories (ROMs), random access memories (RAMs), EPROMs, EEPROMs, magnetic or optical cards, application-specific integrated circuits (ASICs), or any type of media suitable for storing electronic instructions and each coupled to a computer system bus. Furthermore, the computers referred to in the specification may include a single processor or may be architectures employing multiple processor designs for increased computing capability.

The methods, devices, and systems described herein are not inherently related to any particular computer or other apparatus. Various general-purpose systems may also be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein.

Described herein are systems and methods for implementing a low power correlator architecture using distributed arithmetic. These systems and methods can be used to implement a finite impulse response (FIR) filter with improved power consumption and smaller footprint than conventional implementations of an FIR filter.

Figure 1:
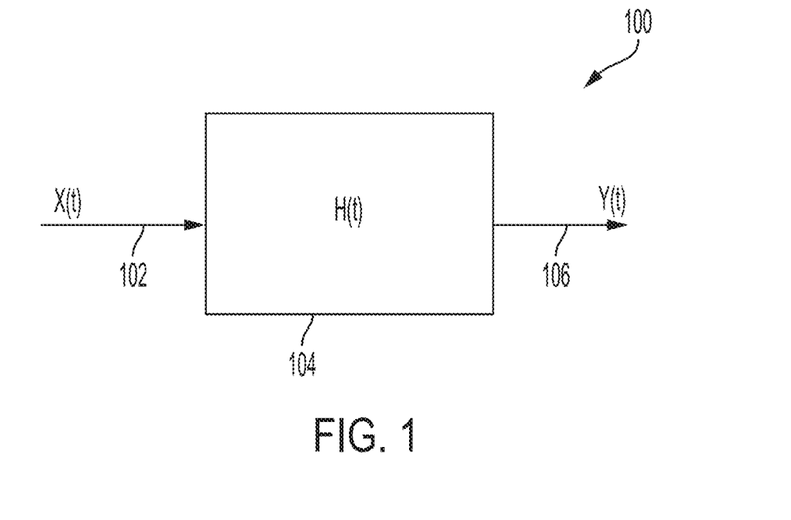
FIG. 1 illustrates an exemplary signal filter according to examples of the disclosure.

In the context of signal processing, filters are devices/components that can be employed in a signal processing system to remove unwanted frequency components of a given signal. FIG. 1 illustrates an exemplary signal filter according to examples of the disclosure. The example 100 of FIG. 1 illustrates a filter 104 that accepts an input 102, processes the input, and produces an output 106. In one or more examples, the input signal accepted at input 102 can have time domain function represented by X(t).

The filter 104 can have a time domain representation expressed as H(t), and the output 106 can have a time domain representation of Y(t). The relationship between X(t) and Y(t) can be expressed by equation 1 provided below:

$$X(t)*H(t)=Y(t) \tag{1}$$

Equation 1 above illustrates that Y(t) is a product of the time domain convolution of X(t) (i.e., the input signal) and the filter response H(t) which can alternatively be expressed in the form of equation 2 provided below:

$$\int_{-\infty}^{\infty} X(t)h(t-\tau)d\tau = Y(t) \tag{2}$$

A convolution of two signals in the time domain can be expressed as multiplication of the two signals' frequency response. Thus, in the frequency domain, the relationship between X(t) and Y(t) can be expressed in the form of equation 3 provided below:

$$X(f)H(f)=Y(f) \tag{3}$$

Figure 2:
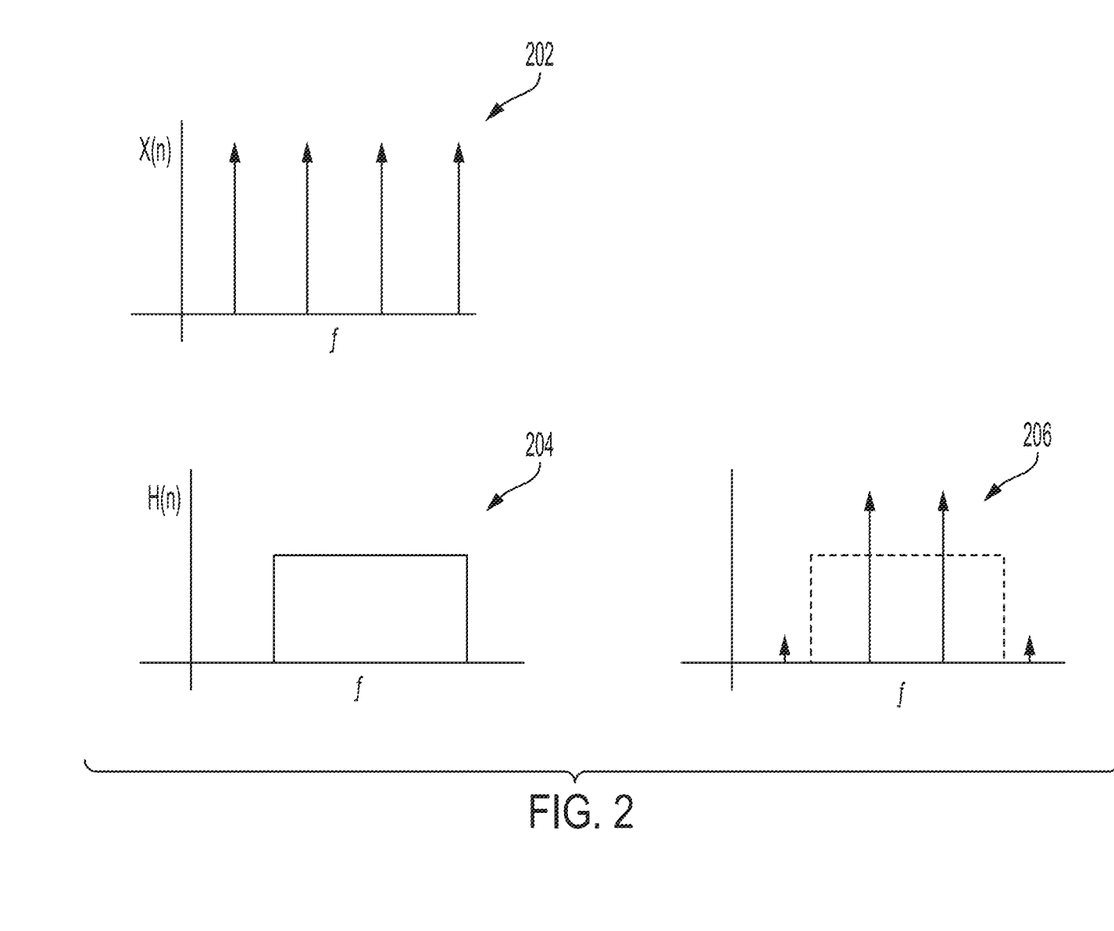
FIG. 2 illustrates exemplary frequency responses of an input signal, a filter, and an output signal according to examples of the disclosure.

Using the mathematical relationships expressed above in equations 1-3, the filter 104 can be configured to remove unwanted frequency content from an input signal (i.e., X(t)). In one or more examples, the filter 104 can be configured such that it has a frequency response that attenuates the portion of a signal containing content within a certain frequency range while allowing the portion of the signal containing content within a certain frequency range (i.e., the passband) to pass through. FIG. 2 illustrates exemplary frequency responses of an input signal, a filter, and an output signal according to examples of the disclosure. In the example of FIG. 2, the frequency response of an input signal is illustrated at graph 202, while the frequency response of a filter is illustrated at graph 204. As discussed above with respect to equation 3, the frequency response of the output signal of the filter can be the result of the multiplication of the frequency response of the input signal and the frequency response of the filter. Graph 206 can represent the frequency response of the output signal. Assuming that the frequency response of the filter is such that it attenuates any signal that is not within the passband of the filter, graph 206 illustrates that the frequency content of the signal shown in graph 202 that lies outside the frequency passband of the filter shown in graph 204 is attenuated, while the frequency content that lies within the passband is allowed to pass.

The filter and equations described above can be implemented in discrete/digital systems as well. Digital filters can be implemented using a Finite Impulse Response (FIR) representation. An FIR filter is a filter whose impulse response eventually settles to zero thus making the impulse response have a finite duration. An FIR filter can be expressed mathematically as a correlation, as shown in equation 4:

$$Y = \sum_{n=1}^{N} A_n \times X_n \tag{4}$$

Where $A_n$=L-bit wide coefficient, $X_n$=M-bit wide input data, and N=number of contiguous input samples (taps). Multiple techniques have been used to implement digital FIR filters; however, commonly FIR filters are implemented using a multiply and accumulate (MAC) architecture. MAC architectures compute the product of a filter coefficient and a data sample and then add the product to an accumulator. As indicated by equation 4 above, successive samples of the input $X_n$ are multiplied by a filter coefficient $A_n$, with the product being accumulated to determine the output signal Y. Since implementing digital FIR filters in the manner described above requires manipulating successive samples of an input signal X, a filter designer may choose the number of "taps" to implement the filter. An FIR tap can refer to the maximum amount of delay applied to an input signal X in order to generate the output filtered response Y. The number of taps can be an indication of the amount of memory required to implement the filter and can also indicate how many computations will be required to implement the digital filter. Selecting the number of taps with which to implement an FIR filter can include a tradeoff in which a higher number of taps may lead to improved stopband performance but may require more power and computing resources. In contrast, a lower number of taps can lead to simplicity in design and lower power consumption, but the filter may not adequately attenuate frequency content in the stopband of the filter.

An N-tap FIR implementation can require the multiplication of N consecutive data samples with their respective filter coefficients. In one or more examples, the signed bit width of data can be M bits and the signed bit width of the coefficients can be L bits. The individual multiplication results can be signed and can be L+M−1 bit wide, including the sign bit. The multiplier outputs can be added together using an adder tree. The number of adder stages required can be the rounded-up result of $\log_2 N$. Each adder stage can add 1 bit to the output. The bit width of the final untruncated result can thus be L+M−1+ceil($\log_2 N$).

Figure 3:
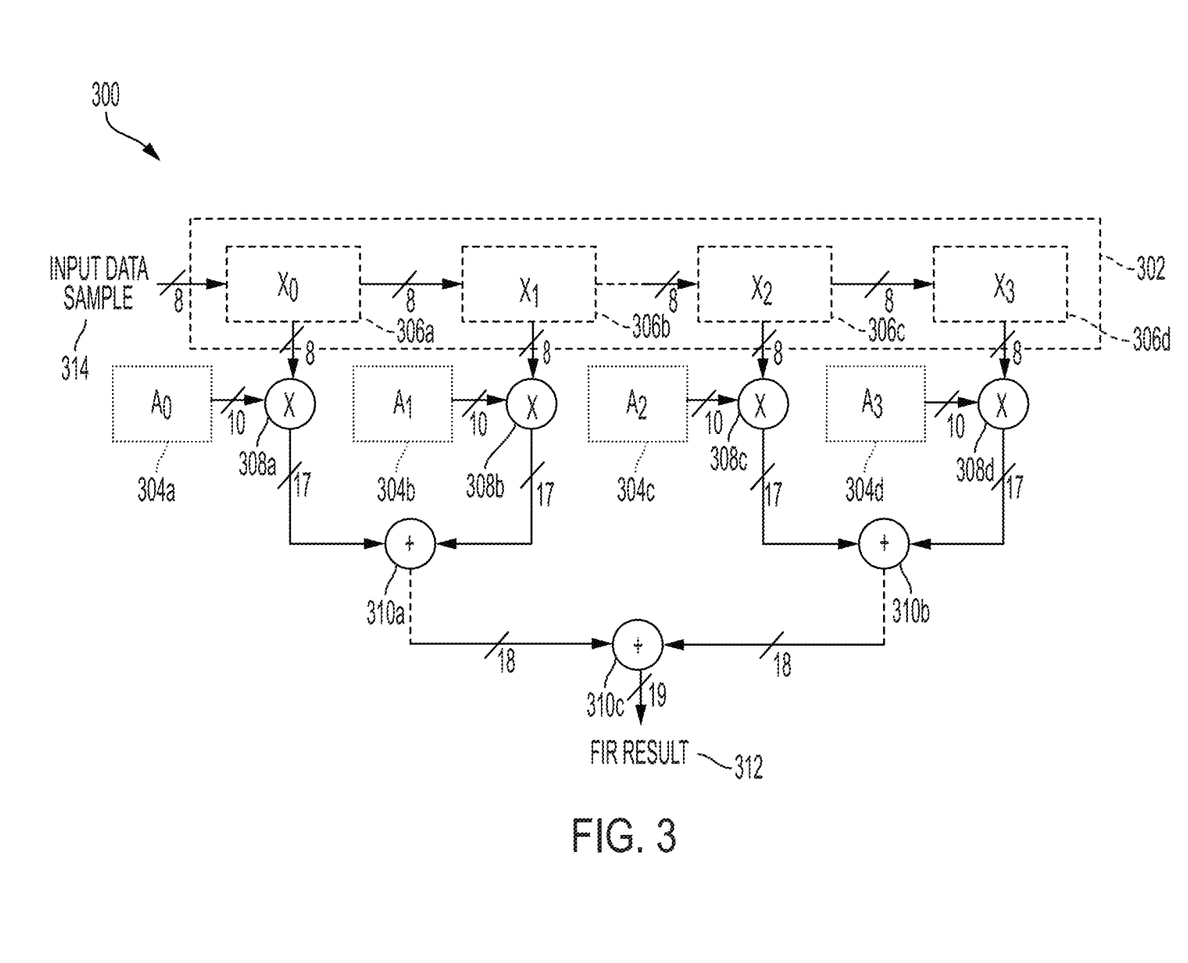
FIG. 3 illustrates an exemplary multiplier-based implementation of an FIR filter according to examples of the disclosure.

FIG. 3 illustrates an exemplary multiplier-based implementation of an FIR filter according to examples of the disclosure. The example of FIG. 3 can illustrate an exemplary implementation of a 4 tap FIR filter using a MAC architecture. As depicted in FIG. 3, the circuit 300 used to implement the 4 tap FIR filter can include a shift register 302. The shift register 302 can include 4 delay line taps (306*a-d*) that can store four consecutive samples of an input data sample 314. Thus, as an example, delay line tap 306*a* can store the current sample that has arrived at the input 314. Delay line tap 306*b* can store the sample immediately before the current input sample. Delay line tap 306*c* can store the sample that arrived two cycles before the current input sample. Finally delay line tap 306*d* can store the sample that arrived three cycles before the current input sample. In this way, shift register 302 can store four contiguous (in time) sample of the input signal arriving at input 314.

Each input data sample 314 can include, in one or more examples, a plurality of bits that are used to represent each sample. In the example of FIG. 3, 8 bits can be used per data sample. As indicated above, the input data can be formatted such that each sample includes a sign bit, indicating whether the input data signal is positive or negative. Thus, in a scheme where the input data samples are each 8 bits wide, the input data samples can have a sign bit and 7 bits of data.

As indicated by equation 4, an FIR filter can be applied to an input data signal, by multiplying each N contiguous samples of input data with a coefficient. Thus, in the example of FIG. 3, each input data sample stored at delay taps 306*a-d* can be multiplied by a coefficient 304*a-d*, using a series of multipliers 308*a-d*. For example, the signal stored at tap 306*a* can be multiplied by a coefficient stored at 304*a* using multiplier 308*a*. The signal stored at tap 306*b* can be multiplied by a coefficient stored at 304*b* using multiplier 308*b*. The signal stored at tap 306*c* can be multiplied by a coefficient stored at 304*c* using multiplier 308*c*. Finally, the signal stored at tap 306*d* can be multiplied by a coefficient stored at 304*d* using multiplier 308*d*.

In the example of FIG. 3, input data samples 314 can be 8 bits (as discussed above), while each coefficient 304*a-d* can be 10 bits, therefore making the outputs of multipliers 308*a-d* 17 bits wide. Once each input sample stored in the delay tap lines 306*a-d* has been multiplied with its corresponding coefficient 304*a-d*, the results of the multiplications can be accumulated using adders 310*a-c*, as shown in the figure. Adder 310*a* can accept the 17 bit result of the multiplication of delay tap line 306*a* and coefficient 304*a*, and the 17 bit result of the multiplication of delay tap line 306*b* and coefficient 304*b*, to produce an 18 bit result at its output. Adder 310*b* can accept the 17 bit result of the multiplication of delay tap line 306*c* and coefficient 304*c*, and the 17 bit result of the multiplication of delay tap line 306*d* and coefficient 304*d*, to produce an 18 bit result at its output. The two outputs from adders 310*a* and 310*b* can then be added together at adder 310*c* to produce a 19 bit result 312 can that can represent the final FIR filtered output result.

As shown above, the implementation of a 4 tap FIR filter can necessitate the use of 4 multipliers and 3 adders in order to implement a MAC architecture. The use of multipliers in a MAC architecture can be a primary driver behind the often cumbersome power requirements engendered when implementing an FIR filter. Multipliers are also notorious for causing speed performance issues, as they tend to have long internal logic paths that can take a substantial amount of time to traverse. Furthermore, MAC architectures can take up a substantial amount of area on a chip or circuit.

An alternate approach to using a sample-level MAC architecture to implement an FIR filter is to instead employ a Distributed Arithmetic (DA) implementation. As is described in detail below, the key advantage of implementing an FIR filter using a DA architecture is that the implementation can result in removal of multipliers from the implementation, which, as discussed above, may be a constraining resource on an application. As discussed in detail below, a digital FIR filter that employs a DA architecture can perform a bit-level rearrangement of the multiplication described above with a MAC architecture. By implementing a DA architecture, the power consumption, speed, and footprint of the FIR filter can be significantly improved.

As discussed above, the DA architecture implements a bit-level rearrangement of the multiplication described above with respect to a MAC architecture. The multiplication in the DA architecture can be performed at the input data sample's bit level instead of the complete word (a collection of M bits), as was done in a MAC architecture. This can mean that every single sample bit is multiplied with its corresponding coefficient. The result can then be aggregated using an adder tree. Alternatively, a DA architecture can also be viewed as implementing multiply and accumulate (MAC) logic for every data bit. As described in detail below, instead of having a large M-by-L MAC (such as in the example of FIG. 3), the DA architecture can have M 1-by-L MACs, where M is the number of bits in the data sample and L is the number of bits in the coefficient. The result from M bit-level MACs can then be shifted left by the amount determined by the bit's position in the data sample word. For example, bit 0 (least significant bit) MAC result is not shifted, bit 1 MAC result is shifted left by 1, bit 2 MAC result is shifted left by 2, and so on. The shifted results are then added together, except for the sign bit, which is subtracted, for the final FIR result.

To better understand the DA architecture, a derivation of the underlying concept is provided below. Equation 4, as described above, can represent a method for implementing a digital FIR filter at the sample level. For convenience, equation 3 is reproduced below:

$$Y = \sum_{n=1}^{N} A_n \times X_n$$

As discussed above, $X_n$ can represent an input sample, wherein the input sample is composed of a plurality of bits. More specifically, each input data sample can be expressed as a scaled two's complement binary number comprising of M bits. Thus, each input data sample can be written according to equation 5 below:

$$X_n = -b_{n0} + \sum_{m=1}^{M-1} b_{nm} \times 2^{-m} \quad (5)$$

Where, $|X_n|<1$, and $b_{n0}$=Sign bit (most significant bit). Substituting the bit-level representation of $X_n$ in equation 4 can yield equation 6 below:

$$Y = \sum_{n=1}^{N} A_n \times \left[ -b_{n0} + \sum_{m=1}^{M-1} b_{nm} \times 2^{-m} \right] \quad (6)$$

Distributing the coefficient can result in equation 7 below:

$$Y = -\sum_{n=1}^{N} A_n \times b_{n0} + \sum_{n=1}^{N} \sum_{m=1}^{M-1} A_n \times b_{nm} \times 2^{-m} \quad (7)$$

Expanding the inner sigma operator can yield equation 8 below:

$$Y = -\sum_{n=1}^{N} A_n \times b_{n0} + \sum_{n=1}^{N} [(A_n \times b_{n1}) \times 2^{-1} + \\ (A_n \times b_{n2}) \times 2^{-2} + \ldots + (A_n \times b_{n(M-1)}) \times 2^{-(M-1)}] \quad (8)$$

Expanding the sigma operator again can yield equation 9 below:

$$Y = -[b_{10} \times A_1 + b_{20} \times A_2 + \ldots + b_{N0} \times A_N] + [b_{11} \times A_1 \times 2^{-1} + \\ b_{12} \times A_1 \times 2^{-2} + \ldots + b_{1(M-1)} \times A_1 \times 2^{-(M-1)}] + [b_{21} \times A_2 \times 2^{-1} + \\ b_{22} \times A_2 \times 2^{-2} + \ldots + b_{2(M-1)} \times A_2 \times 2^{-(M-1)}] + \\ \ldots + [b_{N1} \times A_N \times 2^{-1} + b_{N2} \times A_N \times 2^{-2} + \\ \ldots + b_{N(M-1)} \times A_N \times 2^{-(M-1)}] \quad (9)$$

Reordering vertically based on bit location (power of 2) can yield equation 10 below:

$$Y = -[b_{10} \times A_1 + b_{20} \times A_2 + \ldots + b_{N0} \times A_N] + [b_{11} \times A_1 + \\ b_{21} \times A_2 + b_{31} \times A_3 + \ldots + b_{N1} \times A_N] \times \\ 2^{-1} + [b_{12} \times A_1 + b_{22} \times A_2 + b_{32} \times A_3 + \ldots + b_{N2} \times A_N] \times 2^{-2} + \\ \ldots + [b_{1(M-1)} \times A_1 + b_{2(M-1)} \times A_2 + \ldots + b_{N(M-1)} \times A_N] \times 2^{-(M-1)} \quad (10)$$

Finally, re-inserting the sigma operating back into equation 10 can yield equation 11 below:

$$Y = -\sum_{n=1}^{N} A_n \times b_{n0} + \sum_{m=1}^{M-1} \left[ \sum_{n=1}^{N} A_n \times b_{nm} \right] 2^{-m} \quad (11)$$

Using equation 11 above, the inner sigma operation illustrates that each bit of each input sample is multiplied with its coefficient and the result aggregated. Thus, equation 11 can be equivalent to the bit-level MAC operation. The outer sigma operation aggregates each bit-level MAC (i.e., the inner sigma operator), except the sign bit MAC, after multiplying it with the appropriate power of 2 based on bit location in the data sample. The bit-level MAC result of the sign bit is subtracted from the aggregate of all other bit-level MACs to yield the final FIR result.

In order to develop a circuit that can implement the DA design described above, the circuit should preferably be able to perform the following steps: (1) implement a bit-level MAC implementation for all data sample bits; (2) appropriately shift each bit-level MAC based on the bit location in the data sample; (3) sum all the bit-level MAC results (except for the sign bit); and (4) subtract the sign bit MAC result from the sum of shifted bit-level MACs.

With respect to step 1, i.e., implementing a bit-level MAC implementation for all data sample bits, the circuit instead of using multipliers as in the example of FIG. 3 can instead employ logic gates to effect the multiplication. As discussed above, multipliers can be expensive in terms of power consumption, speed, and footprint, and thus by effecting the multiplication in a bit wise operation using logic gates, the circuit can thus consume less power, operate faster, and occupy a smaller footprint in contrast to the MAC architecture described above with respect to FIG. 3.

As discussed in detail below, in order to implement a bit-level MAC architecture, one bit from each delay tap line (i.e., 306*a-d*) can be multiplied with its corresponding coefficient (i.e., 304*a-d*) and the results aggregated to generate a bit-level MAC result.

Figure 4:
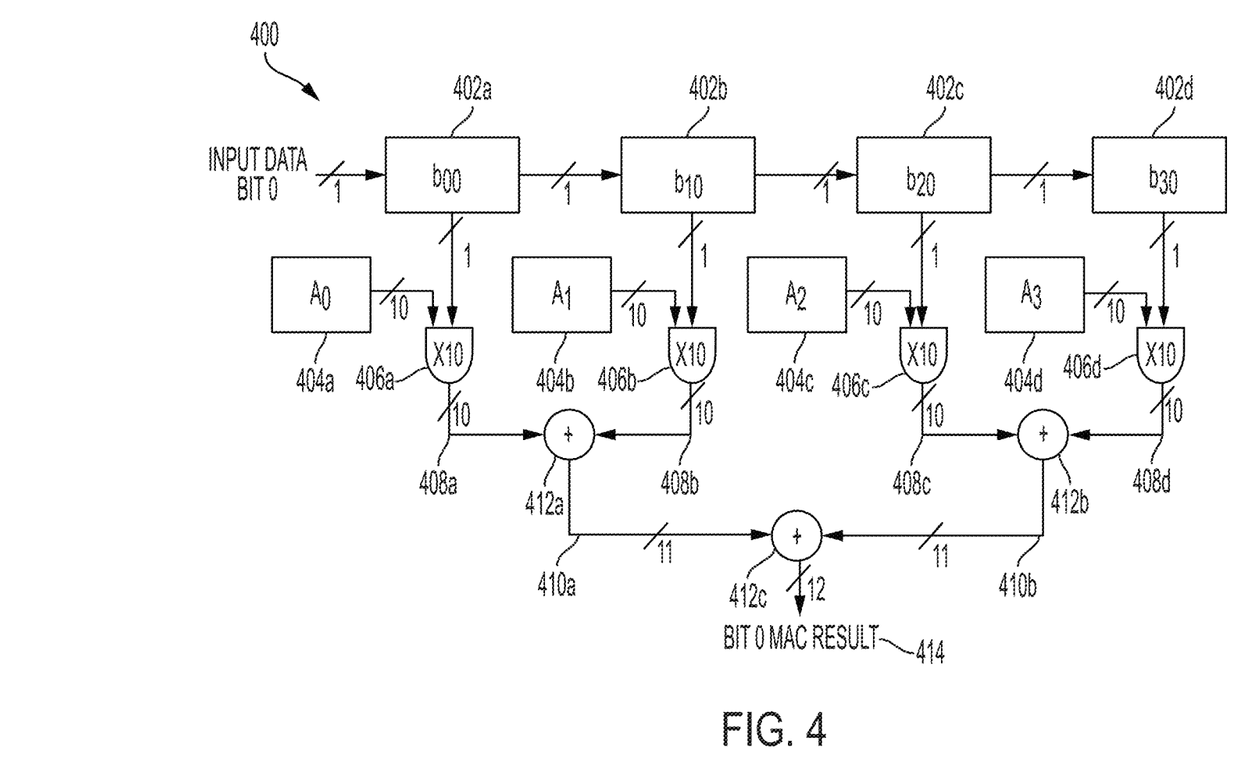
FIG. 4 illustrates an exemplary FIR filter implementation that uses bit-level multiply and accumulate circuits to produce a final multiply and accumulate result according to examples of the disclosure.

FIG. 4 illustrates an exemplary FIR filter implementation that uses bit-level multiply and accumulate circuits to produce a final multiply and accumulate result according to examples of the disclosure. The circuit 400 depicted in FIG. 4 can represent a bit-level MAC implementation for the "0$^{th}$" bit, i.e., the least significant bit for each data sample stored in the delay tap lines. Thus, in the figure, bit "b$_{00}$" stored at 402*a* can represent the least significant bit of the current input sample. Bit "b$_{10}$" stored at 402*b* can represent the least significant bit of the previous input sample. Bit "b$_{20}$" stored at 402*c* can represent the least significant bit of the input sample received two cycles prior. Finally, bit "b$_{30}$"

stored at 402d can represent the least significant bit of the input sample received three cycles prior.

Similar to the example of FIG. 3, each bit stored at 402a-d can be multiplied by its corresponding coefficient 404a-d. Thus, bit "$b_{00}$" can be multiplied by coefficient "$A_0$" stored at 404a. Bit "$b_{10}$" can be multiplied by coefficient "$A_1$" stored at 404b. Bit "$b_{20}$" can be multiplied by coefficient "$A_2$" stored at 404c. Finally bit "$b_{30}$" can be multiplied by coefficient "$A_3$" stored at 404d.

Since the bits stored at 402a-d represent one single bit, to effect a multiplication with their corresponding coefficients 404a-d, an and operation can be performed on each bit and its corresponding coefficient. As discussed, the coefficients can be 10 bits wide, while each bit stored at 404a-d is 1 bit wide. Thus, when both the bit and the coefficient are multiplied together using the AND gate, the result will either be the coefficient itself, if the corresponding bit is 1, or the result will be "0", if the corresponding bit is 0.

In the example of circuit 400, bit "$b_{00}$" stored at 402a and its corresponding coefficient stored at 404a can act as inputs to AND gate 406a and the output can be generated at 408a. Each AND gate 406a-d, described above and below, while pictured as one AND gate, can actually represent 10 separate AND gates, one AND gate for each individual bit of the coefficient stored at 404a-d respectively. In one example, if bit "$b_{00}$" is a 1, then the output at 408a can simply be the same as the value of coefficient $A_0$ stored at 404a. Bit "$b_{10}$" stored at 402b and its corresponding coefficient stored at 404b can act as inputs to AND gate 406b and the output can be generated at 408b. In one example, if bit "$b_{10}$" is a 1, then the output at 408b can simply be the same as the value of coefficient $A_1$ stored at 404b. Bit "$b_{20}$" stored at 402c and its corresponding coefficient stored at 404c can act as inputs to AND gate 406c and the output can be generated at 408c. In one example, if bit "$b_{20}$" is a 1, then the output at 408c can simply be the same as the value of coefficient $A_2$ stored at 404c. Bit "$b_{30}$" stored at 402d and its corresponding coefficient stored at 404d can act as inputs to AND gate 406d and the output can be generated at 408d. In one example, if bit "$b_{30}$" is a 1, then the output at 408d can simply be the same as the value of coefficient $A_3$ stored at 404d.

As discussed above, each of the outputs 408a-d from the AND gates 406a-d can be aggregated to generate a bit-level MAC result. Thus, the 10 bit output 408a of AND gate 406a can be added with the 10 bit output 408b of AND gate 406b to generate the 11 bit output 410a using adder 412a. The 10 bit output 408c of AND gate 406c can be added with the 10 bit output 408c of AND gate 406d to generate the 11 bit output 410b using adder 412b. Finally, the 11 bit output 410a and the 11 bit output 410b can be added together using adder 412c to generate the final 12 bit, bit-level MAC result.

The circuit depicted in FIG. 4 can be repeated for each bit of each data sample stored in the tap delay lines. Thus, in the examples described above, in a system in which each input data sample contains 8 bits, 7 separate bit-level MAC results can be generated (the $8^{th}$ bit, as discussed above, is a sign bit and thus is not required to be multiplied with a coefficient). Returning to the discussion above with respect to the steps that the circuit can carry out to implement a DA architecture, after the completion of step 1, the circuit can implement steps 2 and 3, i.e.: (2) appropriately shift each bit-level MAC based on the bit location in the data sample; and (3) sum all the bit-level MAC results (except for the sign bit).

Figure 5:
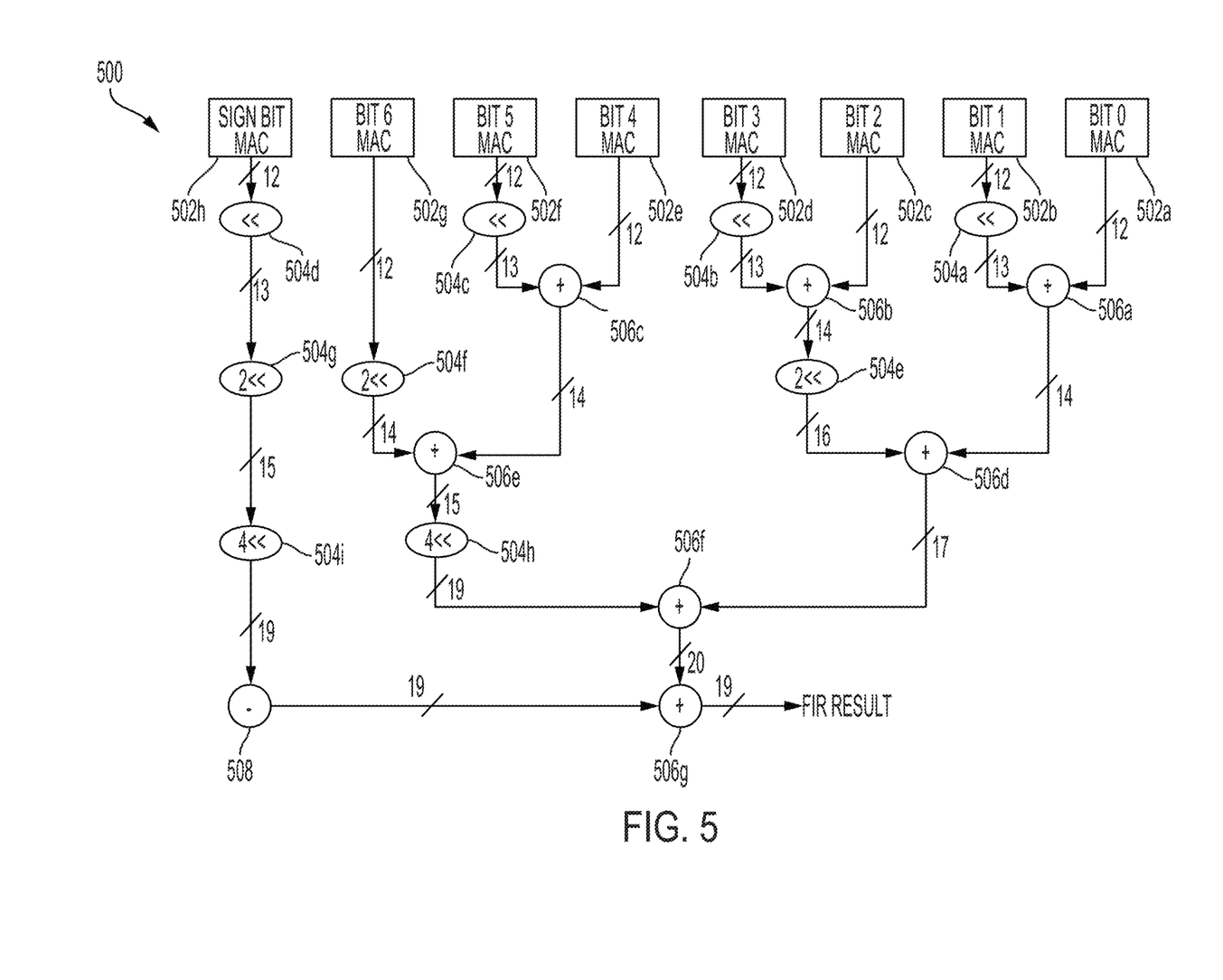
FIG. 5 illustrates another exemplary bit-level multiply and accumulate circuit implementation according to examples of the disclosure.

FIG. 5 illustrates an exemplary shift and sum implementation of a distributed arithmetic implementation of an FIR filter according to examples of the disclosure. The circuit 500 can implement steps 2 and 3 described above. Specifically, the circuit 500 can take the bit-level MAC results generated for each bit of the input sample, appropriately shift each bit-level MAC result based on the bit location in the data sample, and sum each shifted bit-level MAC result (except for the sign bit).

After all bit-level MAC results are available, they can be multiplied with their respective power of 2 before they are added. The shifting technique can be explained using a simple decimal math example. Take the example of multiplying 17*23, which equals 391. The task can be broken down by performing two multiplications and an addition. First, 17 can be multiplied by two to get 34. However, since the 2 is in the tens place of the number 23, the 34 result can be shifted by one decimal (i.e., adding a zero to the end) to get 340. Then, 17 can be multiplied by 3 to get 51. Since the 3 in 23 is in the ones place, the result does not have to be shifted. Finally, 340 can be added to 51 to get the final result of 391. The same concept can be extended to binary math. As an example, the unsigned binary operation 101*101 can be solved as (10100+00+101)=11001. The number 1 at the $2^2$ position has two zeros added due to its location.

Returning to the example of FIG. 5, the circuit 500 can take as an input each bit-level MAC result generated from the individual bits of each input sample. Thus, in the example where each input sample includes 8 bits, the circuit 500 can accept at its input bit-level MAC results 502a-g, and the sign bit-level MAC result 502h. Each bit-level MAC result 502a-g can be shifted appropriately and aggregated. Bit 0 MAC result 502a can be directly aggregated since it is the least significant bit and therefore does not require any shifting. Thus, in the example of circuit 500, bit 1 MAC result 502b can be shifted by one place using shifter 504a and can then be added (using adder 506a) to bit 0 MAC result 502a, which is not shifted since it is the least significant bit.

Bit 3 MAC result 502d can be shifted by one bit and added to the bit 2 MAC result 502c using adder 506b. The output of adder 506b can be shifted two places using shifter 504e. In this way, bit 2 MAC result 502c can be aggregately shifted by two places, while bit 3 MAC result 502d can be aggregately shifted by three places. The output of shifter 504e can be added to the output of adder 506a using adder 506d.

Bit 5 MAC result 502f can be shifted by one bit added to the bit 4 MAC result 502e using adder 506c. Bit 6 MAC result 502g can be shifted by two places using shifter 504f, and can then be added to the output of adder 506c using adder 506e. The output of adder 506e can then be shifted by four places using shifter 504h. Thus, in aggregate, bit 4 MAC result 502e can be shifted 4 bits, bit 5 MAC result 502f can be shifted 5 bits, and bit 6 MAC result 502g can be shifted 6 bits. The output of shifter 504h can be added to the output of adder 506d using adder 506f.

Finally, the sign bit MAC result 502h can be shifted seven places using shifters 504d, 504g, and 504i as shown, can then be inverted using inverter 508 (so as to subtract the sign bit MAC result from the sum of shifted bit-level MACs in accordance with step 4), and can then be added to the output of adder 506f using adder 506g. The output of adder 506g can represent that final FIR result, with all bit-level MAC-level results 502a-h having been appropriately shifted and aggregated in accordance with steps 2, 3, and 4 described above.

In the example implementation described above with respect to FIG. 4, the more significant bit-level MAC of a pair of bit-level MACs may undergo a certain amount of left shift before being added to the less significant MAC. The amount of shift performed can be dependent on the stage of calculation. For example, the bit 0 MAC 502a can shift left $2^0$ (1), bit 1 MAC 502b can shift $2^1$ (2), bit 2 MAC 502c can shift $2^2$ (4), and so on. In one or more examples, an alternate implementation (not shown) may choose to do all shifts first based on the sample bit's significance and then add them all together using an adder tree. Selecting either of these implementations does not make a distinguishable difference in the area or the power consumption of the design.

While the circuit described above with respect to FIGS. 4 and 5 can generate power savings, increased speed, and a lower footprint when compared to a sample-level MAC architecture of FIG. 2, the use of logic gates to effect the multiplication can still consume a substantial amount of power, therefore acting as a constraint on the design of an FIR filter. However, a larger power savings can also be achieved using logic optimization. In one or more examples, the logic optimization can focus on the first few stages of the DA implementation, which can include the bit-level multipliers (logic AND gates) and the adders used in bit-level MAC calculations. In the example of FIGS. 4 and 5 described above, there can be L*M*N logic AND gates and M*(N−1) multi-bit adder cells used to perform the complete bit-level MAC operation, where L is the number of bits in the coefficient, M is the number of bits in the data, and N is the number of taps.

To understand the logic optimizations described below, an analysis of what happens for different combinations of tap data values can be useful. For instance, referring back to FIG. 4, when input data bit 402a is logic 0 at the first tap, the output of AND gate 406 can be zero, else it is equal to $A_0$ (coefficient 0). Similarly, when input data bit 402b is logic 0 at the second tap, the output of AND gates can be zero, else it is equal to $A_1$ (coefficient 1). The logic truth table in the table below can show the output of the adder 410a for various combinations of input data bits 402a and 402b according to examples of the disclosure.

| $b_{10}$ (402b) | $b_{00}$ (402a) | Result (408a) |
|---|---|---|
| 0 | 0 | 0 |
| 0 | 1 | $A_0$ |
| 1 | 0 | $A_1$ |
| 1 | 1 | $A_0 + A_1$ |

The above table could be implemented as a 4-to-1 multiplexer with inputs in the "Result" column and the pair of taps (402a and 402b) used for selection. Implementing the DA architecture using multiplexers to replace multiple logic gates can lead to savings in power consumption and footprint of the circuit.

Figure 6:
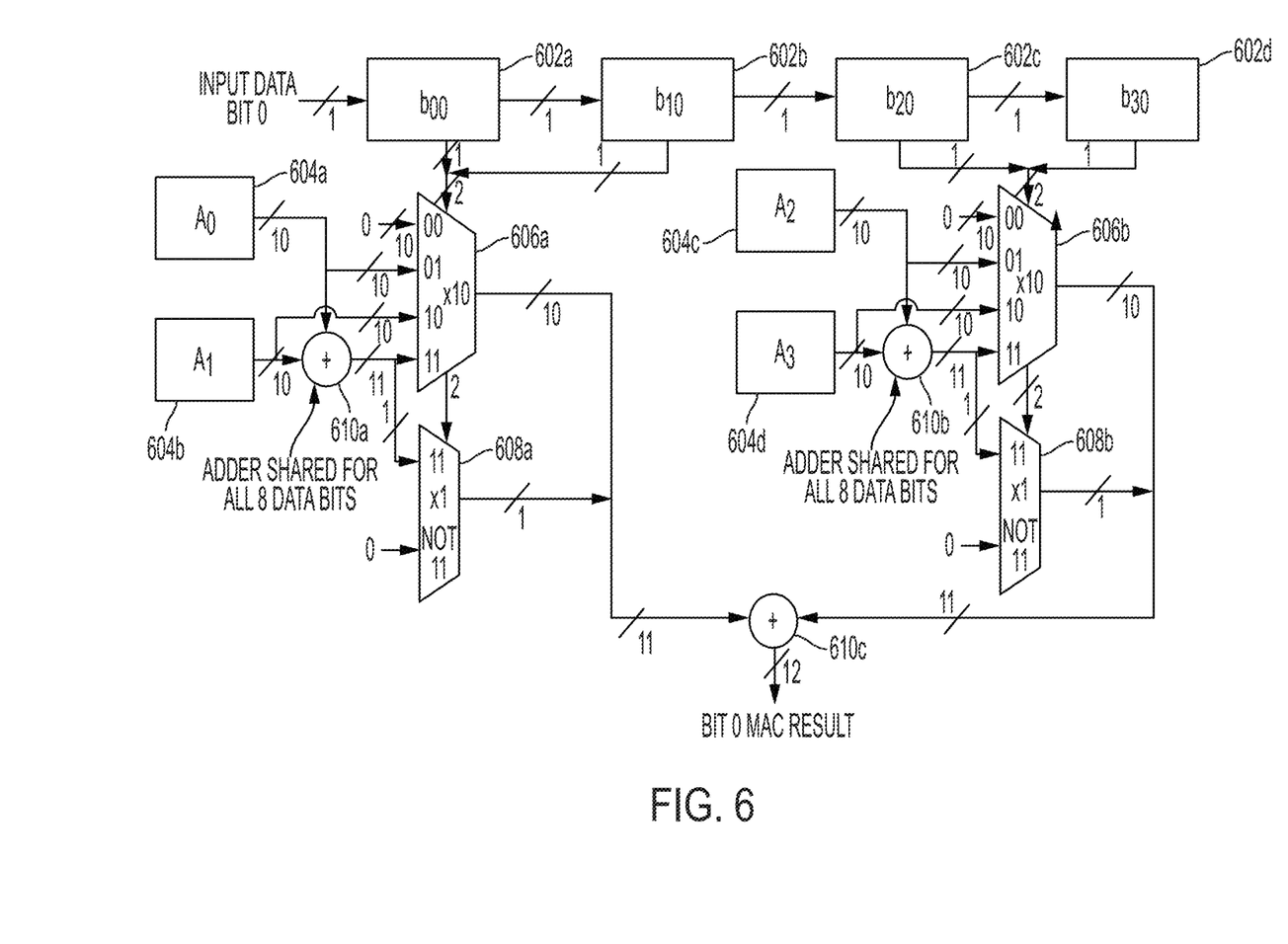
FIG. 6 illustrates an exemplary 4-to-1 multiplexer of FIG. 3 according to examples of the disclosure.

FIG. 6 illustrates another exemplary bit-level multiply and accumulate circuit implementation utilizing multiplexers according to examples of the disclosure. The circuit 600 depicted in FIG. 6 can represent a bit-level MAC implementation for the "$0^{th}$" bit, i.e., the least significant bit for each data sample stored in the delay tap lines (similar to FIG. 4). Thus, in the figure, bit "$b_{00}$" stored at 602a can represent the least significant bit of the current input sample. Bit "$b_{10}$" stored at 602b can represent the least significant bit of the previous input sample. Bit "$b_{20}$" stored at 602c can represent the least significant bit of the input sample received two cycles prior. Finally, bit "$b_{30}$" stored at 602c can represent the least significant bit of the input sample received three cycles prior.

The input bits stored at 602a and 602b can serve as multiplexer select signals to 4-to-1 multiplexer 606a. Multiplexer 606a can have four lines from which one signal to output is selected. When both 602a and 602b are logic 0, the multiplexer 606a can select a logic 0 signal to output. When 602a is a logic 1 and 602b is a logic 0, the multiplexer 606a can select the signal stored at 604a, which can correspond to the coefficient associated with bit "$b_{00}$" stored at 602a. When 602a is a logic 0 and 602b is a logic 1, the multiplexer 606a can select the signal stored at 604b, which can correspond to the coefficient associated with bit "$b_{10}$" stored at 602b. Finally, when both 602a and 602b are logic 1, the multiplexer 606a can select the signal output by adder 610a, which can represent the addition of the signals stored at 604a and 604b. Additionally, when both 602a and 602b are logic 1, a 2-to-1 multiplexer 608a can output the most significant bit (MSB) of $A_0+A_1$ (i.e., the output of adder 610a).

The exact same process can be repeated for bit "$b_{20}$" and "$b_{30}$" stored at 602c and 602d respectively. The input bits stored at 602c and 602d can serve as multiplexer select signals to 4-to-1 multiplexer 606b. Multiplexer 606b can have four lines from which one signal to output is selected. When both 602c and 602d are logic 0, the multiplexer 606b can select a logic 0 signal to output. When 602c is a logic 1 and 602d is a logic 0, the multiplexer 606a can select the signal stored at 604c, which can correspond to the coefficient associated with bit "$b_{20}$" stored at 602c. When 602c is a logic 0 and 602d is a logic 1, the multiplexer 606b can select the signal stored at 604d, which can correspond to the coefficient associated with bit "$b_{30}$" stored at 602d. Finally, when both 602c and 602d are logic 1, the multiplexer 606b can select the signal output by adder 610b, which can represent the addition of the signals stored at 604c and 604d. Additionally, when both 602c and 602d are logic 1, a 2-to-1 multiplexer 608b can output the MSB of $A_2+A_3$ (i.e., the output of adder 610a).

Finally at adder 610c, the outputs of multiplexers 606a and 606b, as well as the outputs of multiplexers 608a and 606b, can be added together, and the output of the adder 610c can represent the final bit-level MAC result.

Figure 7:
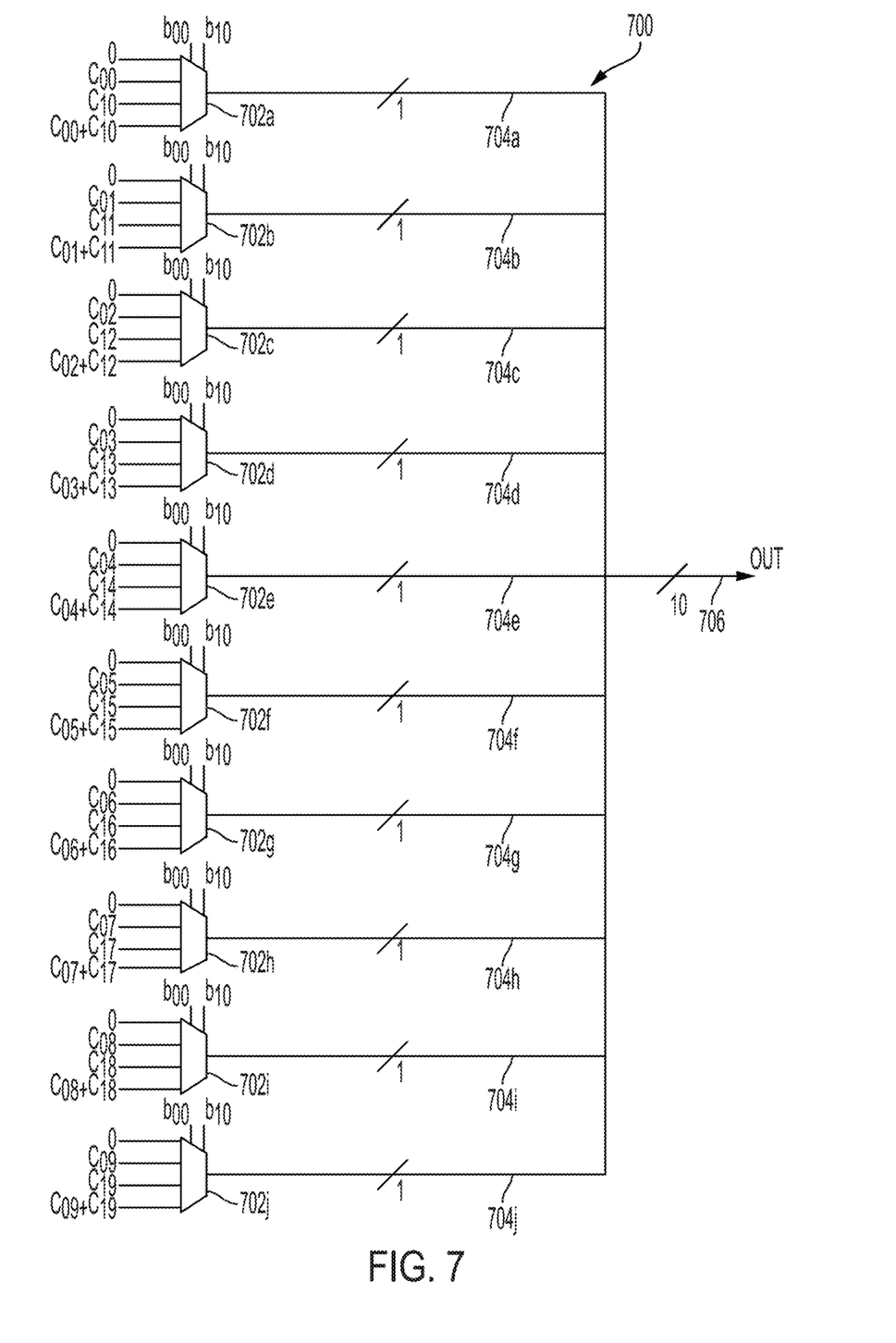
FIG. 7 illustrates an exemplary shift and sum implementation of a distributed arithmetic implementation of an FIR filter according to examples of the disclosure.

In the example described above with respect to FIG. 6, each 4-to-1 multiplexer 606b can actually represent 10 multiplexers that are used to perform multiplexer operations on each individual bit of each coefficient stored at 604a-d. FIG. 7 illustrates an exemplary implementation of the 4-to-1 multiplexers illustrated in FIG. 6. The circuit 700 of FIG. 7 can illustrate an expanded view of the multiplexer 606a illustrated in FIG. 6. The circuit 700 can include 10 separate multiplexers (one multiplexer for each bit in the coefficient) 702a-i that can multiplex at the bit level of each coefficient. Thus, it should be understood that in the example of FIG. 7, while there are 10 multiplexers, the disclosure should not be seen as limiting, as the number of multiplexers can be dependent on the number of bits in the coefficients used to implement the FIR filter.

Each multiplexer can select between 4 inputs, based on the status of bits "$b_{00}$" and "$b_{10}$," whose values are described above with respect to FIG. 6. Based on the values of "$b_{00}$" and "$b_{10}$," each multiplexer 702a-i can select from 0, a single bit of coefficient $A_0$ labeled $C_{0x}$ in the figure, a single bit of coefficient $A_1$ labeled $C_{1x}$ in the figure, and the signal representing the addition of $C_{0x}$ and $C_{1x}$. Each multiplexer 702a-702i can correspond to a specific bit of each coefficient. For example, multiplexer 702a can correspond to the least significant bit of coefficients $A_0$ and $A_1$. Thus, multiplexer 702a can select from a 0 input, $C_{00}$ that corresponds to the least significant bit of coefficient $A_0$, $C_{10}$ that corresponds to the least significant bit of coefficient $A_1$, and the addition of $C_{00}$ and $C_{10}$. Multiplexer 702b can select from a 0 input, $C_{01}$ that corresponds to the first bit of coefficient $A_0$ (assuming the least significant is the $0^{th}$ bit of coefficient $A_0$), $C_{11}$ that corresponds to the first bit of coefficient $A_1$ (assuming the least significant is the $0^{th}$ bit of coefficient $A_1$), and the addition of $C_{01}$ and $C_{11}$. Multiplexer 702c can select from a 0 input, $C_{02}$ that corresponds to the second bit of coefficient $A_0$, $C_{12}$ that corresponds to the second bit of coefficient $A_1$, and the addition of $C_{02}$ and $C_{12}$. Multiplexer 702d can select from a 0 input, $C_{03}$ that corresponds to the third bit of coefficient $A_0$, $C_{13}$ that corresponds to the third bit of coefficient $A_1$, and the addition of $C_{03}$ and $C_{13}$. Multiplexer 702e can select from a 0 input, $C_{04}$ that corresponds to the fourth bit of coefficient $A_0$, $C_{14}$ that corresponds to the fourth bit of coefficient $A_1$, and the addition of $C_{04}$ and $C_{14}$. Multiplexer 702f can select from a 0 input, $C_{05}$ that corresponds to the fifth bit of coefficient $A_0$, $C_{15}$ that corresponds to the fifth bit of coefficient $A_1$, and the addition of $C_{05}$ and $C_{15}$. Multiplexer 702g can select from a 0 input, $C_{06}$ that corresponds to the sixth bit of coefficient $A_0$, $C_{16}$ that corresponds to the sixth bit of coefficient $A_1$, and the addition of $C_{06}$ and $C_{16}$. Multiplexer 702h can select from a 0 input, $C_{07}$ that corresponds to the seventh bit of coefficient $A_0$, $C_{17}$ that corresponds to the seventh bit of coefficient $A_1$, and the addition of $C_{07}$ and $C_{17}$. Multiplexer 702i can select from a 0 input, $C_{08}$ that corresponds to the eighth bit of coefficient $A_0$, $C_{18}$ that corresponds to the eighth bit of coefficient $A_1$, and the addition of $C_{08}$ and $C_{18}$. Multiplexer 702j can select from a 0 input, $C_{09}$ that corresponds to the ninth bit of coefficient $A_0$, $C_{19}$ that corresponds to the ninth bit of coefficient $A_1$, and the addition of $C_{09}$ and $C_{19}$. The outputs 704a-j of each multiplexer 702a-j (which as pictured can be 1 bit wide) can be appropriately combined to form at final 10 bit out 706 of the multiplexer circuit.

In the examples described above, for M data bits, $A_0$ and $A_1$ can be added just once and applied to M*(L+1) number of 4-to-1 multiplexers. The same can apply for all other pairs of taps. Overall, N/2 adders can be required instead of M*N/2 adders for the first stage in M bit-level MACs. In addition, L*M*N 2-input AND gates can replaced with L*M*N/2 4-to-1 multiplexers.

Referring back to FIG. 4, the bit multiplication stage using logic AND gates and the first adder stage can replaced with the 4-to-1 multiplexers, as described above. The table below shows the comparison for the first two stages.

|  | AND2 gates | 4-to-1 Mux | Full Adders |  |
|---|---|---|---|---|
| Regular DA | L*M*N | 320 |  | L*M*N/2 | 160 |
| Modified DA |  | L*M*N/2 | 160 | L*N/2 | 20 |

As shown in the table above, there can be a significant drop in the number of full adders. However, a 4-to-1 multiplexer can be a much larger logic gate than an AND2 gate. Using a standard cell library from a 28 nm technology node as an example, a 4:1 mux can be 5.6 times larger and a full adder can be 3.6 times larger than an AND2 of equivalent drive strength. This implies that the implementation of FIG. 4 is 896 AND2 equivalents and the implementation of FIG. 6 is 968 AND2 equivalents, rendering the implementation illustrated in FIG. 6 slightly larger than the original design.

However, to further realize power and footprint savings, the multiplexer described with respect to FIG. 7 can be further optimized to minimize the power and space required to implement it. If the decode logic for the data bits can be separated from the coefficient selection, it can be shared for all the bits in the coefficient, thereby reducing the components needed to implement the multiplexer.

Figure 8:
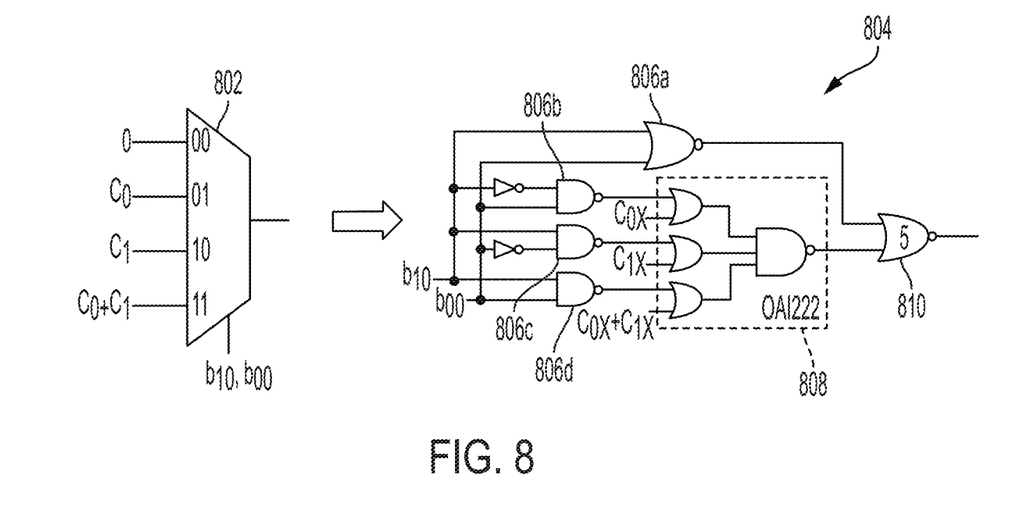
FIG. 8 illustrates an exemplary implementation of a 4-to-1 multiplexer illustrated in FIG. 7 according to examples of the disclosure.

FIG. 8 illustrates an exemplary implementation of a 4-to-1 multiplexer illustrated in FIG. 7 according to examples of the disclosure. In the example of FIG. 8, 4-to-1 multiplexer 802 can represent a single multiplexer of the 10 multiplexers 702a-f illustrated in FIG. 7. Circuit 804 can represent a logic gate implementation of the of the 4-to-1 multiplexer 802.

The circuit 804 can be characterized in two stages. The first stage can include logic gates 806a-d. Each logic gate 806a-d can accept various combinations of the data bits "$b_{00}$" and "$b_{10}$," whose values are described above with respect to FIG. 6. For instance, gate 806a can accept both bits "$b_{00}$" and "$b_{10}$" as inputs. Logic gate 806b can accept "$b_{00}$" and the complement of "$b_{10}$" denoted herein as "$\hat{b}_{10}$." Logic gate 806c can accept as inputs "$\hat{b}_{00}$" and "$b_{10}$." Finally, logic gate 806d can accept at its inputs "$b_{00}$" and "$b_{10}$."

The outputs of logic gates 806a-d can then be fed into a second stage denoted by logic circuit 808 and logic gate 810. Logic circuit 808 can include a logic component that accepts at its input the outputs of gates 806b-d and a single bit from a pair of coefficients used to implement the FIR filter.

As previously discussed with respect to FIG. 7, each multiplexer 702a-j can receive at its input a single bit of coefficient $A_0$ labeled $C_{0x}$ in the figure, a single bit of coefficient $A_1$ labeled $C_{1x}$ in the figure, and the signal representing the addition of $C_{0x}$ and $C_{1x}$. Thus, similar to multiplexers 702a-j, logic component 808 can receive $C_{0x}$ and $C_{1x}$, as well as the addition of the two variables $C_{0x}+C_{1x}$. The output of logic component 808 can be input by logic gate 810, which also can accept at its input the output of logic gate 806a.

The circuit 804 can thus be used to implement a 4-to-1 multiplexer. In the example of FIG. 7, the circuit 804 can be copied 10 times to implement multiplexers 702a-j. However, as discussed above, this type of design can be large and occupy a significant amount of space. However, realizing that the first stage of the circuit 804, i.e., gates 806a-d, accepts inputs that would be common to every multiplexer 702a-j, the circuit can be further optimized to minimize the footprint of the circuit. If the decode logic (i.e., gates 806a-b and their inputs) for the data bits can be separated from the coefficient selection, it can be shared for all the bits in the coefficient. Thus, rather than having to implement gates 806a-d for all 10 multiplexers 702a-j of FIG. 7, instead each multiplexer can share one set of gates 806a-d and their respective outputs.

The table below shows the number of times each component of the decomposed 4-to-1 multiplexer illustrated in FIG. 8 is required in the implementation. Note that the logic gates 806a-d identify the state of the first two taps of the data bit involved. As discussed above, these can be used for all coefficient bit selections removing the multiplicand L from its formula. Although the NAND2 and NOR2 gates are generally smaller, they are considered equal to AND2 for simplicity. The logic component 808, in one or more examples, can be just 1.8 times of AND2 because of its relatively simple structure using transistors. Therefore, the total AND2 equivalents for all 4-to-1 multiplexers can be 412. Adding the AND2 equivalents for 20 full adders, the total AND2 equivalents can be 484. This can be thus a major savings when compared to the original 896 AND2 equivalents without using the 4-to-1 multiplex logic described above.

|  | Gates 1-4 |  | OAI222 |  | Gate 5 |  |
|---|---|---|---|---|---|---|
| 4:1 Mux | 4*(M*N/2) | 64 | L*M*N/2 | 160 | L*M*N/2 | 160 |

The circuit of FIG. 6 that includes the logic optimizations described with respect to FIG. 8 can yield substantial power and footprint savings. As an example, a Synopsys Design Compiler synthesis tool was used to map the RTL to technology gates for an example 32 tap design with 16 bit input sample size and 18 bit coefficient size. Although results presented here are using a specific foundry's 28 nm (equivalent) technology library, other technology libraries were also tested. The trends observed were consistent across all the tested technology nodes.

Logic synthesis results presented here for the example design were generated without using a floorplan, a.k.a., in the non-topographical mode of Design Compiler. This also implies that the clock power is not included. This incurs optimism in the synthesis results but suffices for the comparison of different approaches. Pipelined multipliers, if needed, were implemented using the Synopsys DesignWare IP for optimum pipeline placement.

The table below shows the area and power comparison of the different implementations of the FIR operation using a small filter. The design was synthesized at slow frequency for no pipeline operation, medium frequency for single pipeline operation, and high frequency for dual pipeline operation. All synthesis data assumes 25% switching activity at the inputs to estimate the dynamic power.

|  | Cell Area ($\mu m^2$) | | | Dynamic Power ($\mu W$) | | |
|---|---|---|---|---|---|---|
|  | 0-pipe | 1-pipe | 2-pipe | 0-pipe | 1-pipe | 2-pipe |
| Multiplier-based FIR (i.e., FIG. 3) | 24577 | 30506 | 32436 | 292 | 1347 | 1817 |
| Optimized DA FIR (i.e., FIG. 6, with FIG. 8 optimizations) | 18417 | 21816 | 23409 | 161 | 457 | 795 |
| SAVINGS % | +25.1 | +28.5 | +27.8 | +44.9 | +66.1 | +56.2 |

As shown above, the circuit of FIG. 6 that includes the optimized logic described with respect to FIG. 8 can yield nearly 30% footprint savings, and over 60% power savings when compared to the multiplier-based FIR implementation depicted for example in FIG. 3. The dynamic power savings in the design using the optimized DA are more significant than what can be predicted using the area savings alone. This can be explained by the architecture DA uses for multiplication. Effectively, DA uses a logic AND gate for multiplication, which outputs a zero for three out of four possible input combinations. This results in less switching activity to be propagated down the subsequent adder trees. This massive internal reduction in switching activity is not observed in a multiplier-based design.

Figure 9:
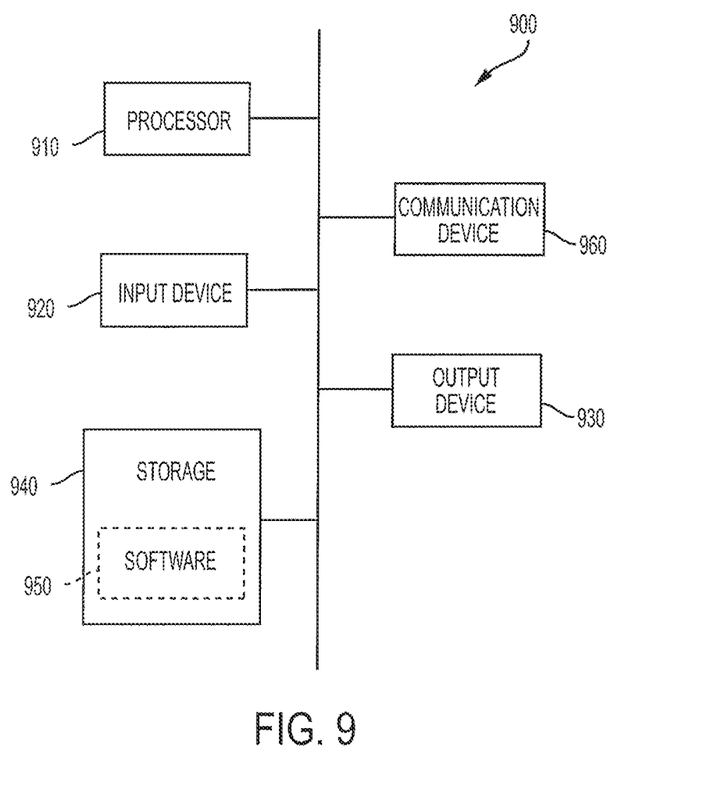
FIG. 9 illustrates an example of a computing device according to examples of the disclosure.

FIG. 9 illustrates an example of a computing device in accordance with one embodiment. Device 900 can be a host computer connected to a network. Device 900 can be a client computer or a server. As shown in FIG. 9, device 900 can be any suitable type of microprocessor-based device, such as a personal computer, workstation, server, or handheld computing device (portable electronic device) such as a phone or tablet. The device can include, for example, one or more of processor 910, input device 920, output device 930, storage 940, and communication device 960. Input device 920 and output device 930 can generally correspond to those described above and can either be connectable or integrated with the computer.

Input device 920 can be any suitable device that provides input, such as a touch screen, keyboard or keypad, mouse, or voice-recognition device. Output device 930 can be any suitable device that provides output, such as a touch screen, haptics device, or speaker.

Storage 940 can be any suitable device that provides storage, such as an electrical, magnetic, or optical memory, including a RAM, cache, hard drive, or removable storage disk. Communication device 960 can include any suitable device capable of transmitting and receiving signals over a network, such as a network interface chip or device. The components of the computer can be connected in any suitable manner, such as via a physical bus or wirelessly.

Software 950, which can be stored in storage 940 and executed by processor 910, can include, for example, the programming that embodies the functionality of the present disclosure (e.g., as embodied in the devices as described above).

Software 950 can also be stored and/or transported within any non-transitory computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 940, that can contain or store programming for use by or in connection with an instruction execution system, apparatus, or device.

Software 950 can also be propagated within any transport medium for use by or in connection with an instruction execution system, apparatus, or device, such as those described above, that can fetch instructions associated with the software from the instruction execution system, apparatus, or device and execute the instructions. In the context of this disclosure, a transport medium can be any medium that can communicate, propagate, or transport programming for use by or in connection with an instruction execution system, apparatus, or device. The transport readable medium can include, but is not limited to, an electronic, magnetic, optical, electromagnetic, or infrared wired or wireless propagation medium.

Device 900 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Device 900 can implement any operating system suitable for operating on the network. Software 950 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

The foregoing description, for purpose of explanation, has been described with reference to specific embodiments.

However, the illustrative discussions above are not intended to be exhaustive or to limit the disclosure to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims.

This application discloses several numerical ranges in the text and figures. The numerical ranges disclosed inherently support any range or value within the disclosed numerical ranges, including the endpoints, even though a precise range limitation is not stated verbatim in the specification because this disclosure can be practiced throughout the disclosed numerical ranges.

The above description is presented to enable a person skilled in the art to make and use the disclosure and is provided in the context of a particular application and its requirements. Various modifications to the preferred embodiments will be readily apparent to those skilled in the art, and the generic principles defined herein may be applied to other embodiments and applications without departing from the spirit and scope of the disclosure. Thus, this disclosure is not intended to be limited to the embodiments shown, but is to be accorded the widest scope consistent with the principles and features disclosed herein. Finally, the entire disclosure of the patents and publications referred in this application are hereby incorporated herein by reference.

What is claimed is:

1. An electronic device for implement a finite impulse response filter, the device comprising:
    a plurality of bit-level multiply and accumulate circuits, wherein each bit-level multiply and accumulate circuit corresponds to a single bit of a plurality of bits, wherein the plurality of bits are associated with a data sample, and wherein each bit of plurality of bits has a position associated with it with respect to the data sample;
    a plurality of shifters configured to operate on a plurality of bit-level results generated by the plurality of bit-level multiply and accumulate circuits, wherein the plurality of shifters shift each result of the plurality of results based on the position of the bit associated with each bit-level multiply and accumulate circuit, and wherein the plurality of shifters are configured such that a plurality of results from each of the shifters when accumulated generate a finite impulse response result.

2. The device of claim 1, wherein each bit-level multiply and accumulate circuit comprises:
    a first delay tap line that stores a first input sample;
    a second delay tap line that stores a second input sample;
    a memory, wherein the memory stores a first coefficient and a second coefficient, wherein the first and second coefficient each include a plurality of bits; and
    a first logic circuit configured to perform an operation on the first input sample stored on the first delay tap line and the first coefficient to generate a first logic circuit result;
    a second logic circuit configured to perform an operation on the second input sample stored on the second delay tap line and the second coefficient to generate a second logic circuit result; and
    one or more adders configured to generate a bit-level result of the plurality of bit-level results, by aggregating the first logic circuit result and the second logic circuit result.

3. The device of claim 2, wherein the first logic circuit comprises:
    a multiplexer, wherein the multiplexer comprises:
        a first line select input, wherein the first line select input receives first input sample stored on the first delay tap line;
        a second line select input, wherein the second line select input second input sample stored on the second delay tap line;
        a plurality of input lines, wherein each input line of the plurality of input lines receives a signal from a group consisting of, a zero bit, a bit of the plurality of bits of the first coefficient, a bit of the plurality of bits of the second coefficient, and a combination of the bit of the first coefficient and the bit of the second coefficient;
    wherein the multiplexer outputs an input line of the plurality of input lines based on the first line select and the second line select.

4. The device of claim 3, wherein each bit-level multiply and accumulate circuit includes a plurality of multiplexers, and wherein each multiplexer of the plurality multiplexers commonly input the bit of the plurality of bits of the first input sample stored on the first delay tap line and the bit of the plurality of bits of the second input sample stored on the second delay tap line.

5. The device of claim 4, wherein each multiplexer of the plurality of multiplexers is implemented using one or more NAND gates, and one or more NOR gates.

6. The device of claim 2, wherein the first logic circuit comprises:
    an AND gate, wherein the AND gate inputs the first delay tap line and the first coefficient and performs a logical AND operation on the inputs.

7. The device of claim 6, wherein the second logic circuit comprises:
    an AND gate, wherein the AND gate inputs the second delay tap line and the second coefficient and performs a logical AND operation on the inputs.

* * * * *